(12) United States Patent
Wise et al.

(10) Patent No.: US 12,145,124 B2
(45) Date of Patent: Nov. 19, 2024

(54) PLASMA POLYMERISATION APPARATUS

(71) Applicant: THE HEART RESEARCH INSTITUTE LTD, Newtown (AU)

(72) Inventors: Steven Garry Wise, Newtown (AU); Miguel Angelo Correia Dos Santos, Newtown (AU)

(73) Assignee: Nanomedx, Inc., Santa Clara, CA (US)

( * ) Notice: Subject to any disclaimer, the term of this patent is extended or adjusted under 35 U.S.C. 154(b) by 922 days.

(21) Appl. No.: 17/273,594

(22) PCT Filed: Sep. 6, 2019

(86) PCT No.: PCT/AU2019/050961
§ 371 (c)(1),
(2) Date: Mar. 4, 2021

(87) PCT Pub. No.: WO2020/047611
PCT Pub. Date: Mar. 12, 2020

(65) Prior Publication Data
US 2021/0252470 A1 Aug. 19, 2021

(30) Foreign Application Priority Data
Sep. 7, 2018 (AU) .............................. 2018903344

(51) Int. Cl.
*B01J 19/08* (2006.01)
*C08F 2/34* (2006.01)
(Continued)

(52) U.S. Cl.
CPC .............. *B01J 19/088* (2013.01); *C08F 2/34* (2013.01); *H10N 19/101* (2023.02);
(Continued)

(58) Field of Classification Search
CPC ............ B01J 19/088; B01J 2219/00121; B01J 2219/00153; B01J 2219/00452;
(Continued)

(56) References Cited

U.S. PATENT DOCUMENTS

2004/0035532 A1    2/2004  Jung
2006/0118242 A1*   6/2006  Herbert ............... C23C 16/5096
                                                        156/345.31
(Continued)

FOREIGN PATENT DOCUMENTS

JP    2008-532760 A    8/2008
KR    20010077659 A    8/2001
(Continued)

OTHER PUBLICATIONS

Kylián et al., "Nanostructured plasma polymers", *Thin Solid Films* 548:1-17 (Dec. 2013), https://doi.org/10.1016/j.tsf.2013.09.003.
(Continued)

*Primary Examiner* — Xiuyu Tai
(74) *Attorney, Agent, or Firm* — Lathrop GPM LLP; Brian C. Trinque; Lisbeth Robinson

(57) ABSTRACT

Plasma polymerisation apparatus is disclosed including a reaction zone and at least one gas inlet for supplying at least one monomer in a gaseous form to the reaction zone, a first electrode and a second electrode spaced apart and configured to generate an electric field in the reaction zone to form plasma polymer nanoparticulate material from the at least one monomer, a plurality of collectors configured to collect plasma-polymer nanoparticulate material formed in the reaction zone, the plurality of collectors being located adjacent the second electrode, and a cooling device located adjacent the second electrode and configured to cool the plurality of collectors. Also disclosed is plasma polymerisation apparatus that includes a confinement grid extending
(Continued)

between a first electrode and a second electrode of the apparatus.

18 Claims, 8 Drawing Sheets

(51) Int. Cl.
    *H10N 19/00*     (2023.01)
    *B82Y 30/00*     (2011.01)
    *B82Y 40/00*     (2011.01)

(52) U.S. Cl.
    CPC ............... *B01J 2219/00121* (2013.01); *B01J 2219/00153* (2013.01); *B01J 2219/00452* (2013.01); *B01J 2219/00594* (2013.01); *B01J 2219/0871* (2013.01); *B01J 2219/0896* (2013.01); *B82Y 30/00* (2013.01); *B82Y 40/00* (2013.01)

(58) Field of Classification Search
    CPC ...... B01J 2219/00594; B01J 2219/0871; B01J 2219/0896; B01J 3/006; B01J 19/285; B01J 12/002; B01J 3/03; B01J 2219/0809; B01J 2219/1942; B01J 2219/0883; B01J 2219/0894; B01J 2219/0879; H10N 19/101; C08F 2/34; B82Y 30/00; B82Y 40/00; C23C 14/562; C23C 14/12; B05D 1/62; H01J 37/32009; H01J 37/32541; H01J 2237/3382; C01B 32/154; C01B 32/15; H05H 1/02; H05H 1/0081; H05H 1/24; H05H 2245/50

See application file for complete search history.

(56) References Cited

U.S. PATENT DOCUMENTS

| | | |
|---|---|---|
| 2007/0085483 A1 | 4/2007 | Ni et al. |
| 2011/0186419 A1 | 8/2011 | Song et al. |
| 2014/0342103 A1* | 11/2014 | Petersen ............... B05D 1/08 427/569 |
| 2016/0222143 A1 | 8/2016 | Conicet et al. |

FOREIGN PATENT DOCUMENTS

| | | |
|---|---|---|
| WO | WO 2006/098581 A1 | 9/2006 |
| WO | 2018112543 A1 | 6/2018 |

OTHER PUBLICATIONS

Santos, M. (Feb. 2018), "Synthesis of Bio-Functional Nanomaterials in Reactive Plasma Discharges", Sydney Medical School, https://ses.library.usyd.edu.au/handle/2123/17921, Abstract, p. 54, 165, 167.

Kovacevic, E. et al. (2009) "Formation and Material Analysis of Plasma Polymerized Carbon Nitride Nanoparticles", Journel of Applied Physics, vol. 105, pp. 104910, 1-8.

Morent, R. et al. "Influence of Operating Parameters on Plasma Polymerization of Acrylic Acid in a Mesh-to-Plate Dielectric Barrier Discharge", Progress in Organic Coatings, 2011, vol. 70, pp. 336-341.

International Search Report for International Application No. PCT/AU2019/050961, dated Nov. 20, 2019.

* cited by examiner

PLASMA POLYMERISATION APPARATUS

CROSS REFERENCE TO RELATED APPLICATION

The present application claims the benefit of priority of AU Provisional Patent Application No. 2018903344, filed 7 Sep. 2018, the content of which is incorporated herein by reference in its entirety.

TECHNICAL FIELD

This application relates to nanoparticulate materials such as nanoparticles and aggregates thereof, including nanoparticles derived from a plasma, which may be used in the formation of conjugates. This application also relates to methods and apparatus for collecting the nanoparticulate material.

BACKGROUND

Multifunctional nanocarriers, capable of delivering multiple molecular cargos within the same structure, are expected to greatly improve both therapeutic and diagnostic outcomes in numerous diseases. However, current nanoparticle-based therapeutics and diagnostics still utilise materials that are not inherently bioactive and arguably do not allow a direct and simple conjugation with pharmaceutical agents. The functionalisation of nanoparticles (e.g., gold, iron-oxide, polymeric, quantum dots, etc.), is typically complex and generally relies on time-consuming, and multi-step protocols to achieve a robust conjugation between the nanocarrier surface and the associated cargo.

Despite the recent rapid growth of nanomedicine research, there is a need for new nanofabrication strategies which can deliver novel products with improved performance, functionality and safety for patients. For instance, in the field of drug delivery in humans, current commercially approved pharmaceutical nanocarriers are based on the concept of passive targeting. In passive targeting the carriers rely on their small size to penetrate the abnormal leaky vasculature of pathological sites, such as tumours or inflammation areas. Although these nanoparticle-drug systems sometimes enhance the efficacy of treatments, when compared to other therapeutic alternatives, deficiencies remain in drug biodistribution and site accumulation. The promise of reduced drug side-effects and increasing dose tolerances has not been realised. In this regard, there has been considerable effort to develop a nanocarrier platform that can potentially provide an active targeted and selective delivery with increased dose tolerance.

In order to achieve specific and targeted delivery in a wide range of therapeutic applications, nanoparticles can be functionalised with different target ligands which recognise and bind to specific surface signatures expressed on target cells. The complexity of the different signalling pathways in multifactorial diseases, such as cancer, has led the way for the development of multi-drug inhibitor based therapies that can circumvent treatment resistance. Importantly, the efficacy of multi-drug approaches is enhanced when different drugs are combined within or on the same nanocarrier. Furthermore, it is also desirable to attain superior control and monitoring over the nanoparticle system during therapy by means of medical imaging, meaning that it would be advantageous for nanoparticles to also incorporate appropriate imaging agents. Thus, there is a strong demand for developing multifunctional nanoparticles with the ability to achieve a tailored mix of different functionalities, integrating both targeted therapy, diagnostics and imaging within the same nanostructure. However, the capacity to bind multiple molecular cargos on the same nanocarrier is particularly elusive in the field.

Additionally, there is significant scope for therapeutic delivery of nucleic acids including DNA, mRNA, and siRNA to regulate aberrant protein expression in disease. This approach has shown great promise in vitro, but has not translated well clinically, i.e., for in vivo procedures. Amongst several drawbacks, when administered systemically, these molecules are: highly unstable in blood; filtered out by the kidneys and liver; and their highly-charged states prevent ready transport across cell membranes. Furthermore, once across a cell membrane, mRNA and siRNA need to escape the endosome to reach the cytoplasm for activity, while DNA needs to enter the nucleus. Nanoparticle platforms, including liposomal nanoparticles have been used to facilitate delivery with intermediate success, which is nevertheless hampered by issues with toxicity and long-term persistence in cells. A nanoparticle platform with the capacity to carry this type of cargo across the cell membrane, preferentially to the cytoplasm or nucleus in a targeted manner, would represent a significant advance for the field.

A nanoparticle with a surface capable of providing robust chemical conjugation sites would be a major breakthrough in the field. In current platforms, one of the limitations to combining multiple functions on a nanoparticle, in a single construct, is the actual surface chemistry of the nanoparticle. To achieve superior control over different functionalities of the nanocarrier, attachment through chemical bonds is preferable over weaker, non-covalent strategies. In order to overcome this difficulty, a common strategy adopted by many commercial platforms is to graft the nanoparticles with polymers, such as poly(ethylene glycol) (PEG). However, these coating and functionalisation strategies involve multi-step, time-consuming and complex protocols that often involve solvents that present safety or disposal difficulties. Moreover, the optimisation, reproducibility and control over the surface concentration and thickness of the PEG are typically difficult to achieve with these conjugation processes. Typically, the terminal groups of the coating ligands also limit the range of biomolecules that can be immobilised. Other conjugation strategies involve the pre-conjugation of molecules with the nanoparticle material in self-assembly processes. However, these latter approaches also rely on the usage of organic solvents and multiple purification steps that compromise the native conformation and functionality of the molecular cargos. The use of multiple synthetic steps may also decrease the final yield of functionalised nanoparticles.

There is therefore a need for an improved process for producing nanoparticles activated for conjugation with therapeutic and/or imaging moieties. Ideally the activated nanoparticles should be capable of being functionalised with multiple functional molecules using simple approaches such as direct incubation with solutions comprising biomolecules.

Plasma polymerization (PP) has been established as a preferred surface deposition platform in technological and biomedical applications. The reactive environment in the plasma fragments and ionizes monomers into building blocks that polymerize and diffuse towards plasma boundaries, causing surface polymerization to take place. Ultimately, the diffusion of these reactive blocks outside the plasma can result in the deposition of thin-films with modulated properties.

In some PP reactions, thin-film deposition (surface polymerisation) occurs simultaneously with plasma bulk polymerisation, resulting in the formation of charged plasma dust particulates i.e., plasma dust or dusty plasmas. For instance, ionization of acetylene in a plasma triggers the continuous formation of carbonaceous nanoclusters that aggregate to form nano—to micron—sized charged particulates in the plasma volume, resulting in the formation of plasma polymer nanoparticles (PPN).

It has been proposed that PPN with tailorable physical and chemical properties may act as a new class of nanoparticles for use in a wide range of nanomedicine applications. Plasma polymerization of nanoparticles in dusty plasmas provides a viable synthesis platform. However, for nanomedicine applications, e.g., clinical use, nanoparticles should be made of a biocompatible material, which is easy to functionalize.

Recently, carbon-based PPN (nanoP$^3$) have been recognised as versatile nano-carriers able to deliver bio-functional cargo without inducing cytotoxicity (see Santos et al. 2018, ACS Applied Materials & Surfaces). NanoP$^3$ are formed in acetylene-based plasmas through the assembly of reactive carbonaceous clusters into spherical nanoparticles, resulting in the surface of nanoP$^3$ being reactive. Radicals and functional surface groups readily immobilize a wide range of functional biomolecules by simple one-step incubation in aqueous solution.

PPN formed in the bulk of plasma reactors have long been considered an undesirable by-product in technological applications. The growth and subsequent surface deposition of PPN represents a source of contamination in the synthesis of microelectronic components. Accordingly, the bulk of research in the field of dusty plasmas has combined modelling and experimental tools to understand the formation of dust particles in reactive plasmas aimed to control particle dynamics in order for their elimination or removal from reactors.

In this regard, a common strategy for removal of PPN involve the application of external forces to manipulate particle dynamics, for example using magnetic fields, to allow particle collection. However, such collection methods are often characterised with low nanoparticle yield, size polydispersity of PPN, or irreversible aggregation. Furthermore, these often require modification of pre-existing plasma chambers with specialized equipment (e.g., power supplies, vacuum feedthroughs) that increases the cost and design complexity. The development of high yield and efficient collection strategies that minimises nanoparticle aggregation have not yet been reported.

There is therefore a need for an improved process for the collection of PPN formed by plasma polymerization of nanoparticles in dusty plasmas.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

SUMMARY

According to one aspect of the present disclosure there is provided a plasma polymerisation apparatus comprising:
a reaction zone;
at least one gas inlet for supplying at least one monomer in a gaseous form to the reaction zone;
a first electrode and a second electrode spaced apart and configured to generate an electric field in the reaction zone to form plasma polymer nanoparticulate material from the at least one monomer;
a plurality of collectors configured to collect plasma-polymer nanoparticulate material formed in the reaction zone, the plurality of collectors being located adjacent the second electrode; and
a cooling device located adjacent the second electrode and configured to cool the plurality of collectors.

In another aspect of the present disclosure there is provided a plasma polymerisation apparatus comprising:
a reaction zone;
at least one gas inlet for supplying at least one monomer in a gaseous form to the reaction zone;
a first electrode and a second electrode spaced apart and configured to generate an electric field in the reaction zone to form plasma polymer nanoparticulate material from the at least one monomer;
a plurality of collectors configured to collect plasma-polymer nanoparticulate material formed in the reaction zone, the plurality of collectors being located adjacent the second electrode; and
a confinement grid extending between the first electrode and the second electrode.

In another aspect of the present disclosure there is provided a method of collecting plasma-polymer nanoparticulate material comprising:
supplying at least one monomer in a gaseous form to a reaction zone;
generating an electric field in the reaction zone, between a first electrode and a second electrode spaced apart from the first electrode, to form plasma polymer nanoparticulate material from the at least one monomer;
collecting plasma-polymer nanoparticulate material formed in the reaction zone in a plurality of collectors adjacent the second electrode; and
cooling the plurality of collectors using a cooling device located adjacent the second electrode.

In yet another aspect of the present disclosure there is provided a method of collecting plasma-polymer nanoparticulate material comprising:
supplying at least one monomer in a gaseous form to a reaction zone;
generating an electric field in the reaction zone, between a first electrode and a second electrode spaced apart from the first electrode, to form plasma polymer nanoparticulate material from the at least one monomer;
confining the plasma using a confinement grid that extends between the first electrode and the second electrode; and
collecting plasma-polymer nanoparticulate material formed in the reaction zone in a plurality of collectors adjacent the second electrode.

BRIEF DESCRIPTION OF DRAWINGS

By way of example only, embodiments of the present disclosure are now described with reference to the Figures in which:
FIG. 1b shows a cross-sectional view of a modified portion of the plasma polymerisation (PP) apparatus of FIG. 1a;

FIG. 2a shows a cross-sectional view of plasma polymerisation (PP) apparatus according to another embodiment of the present disclosure and FIG. 2b shows an oblique view of the apparatus of FIG. 2a;

DESCRIPTION OF EMBODIMENTS

Figure 1A:
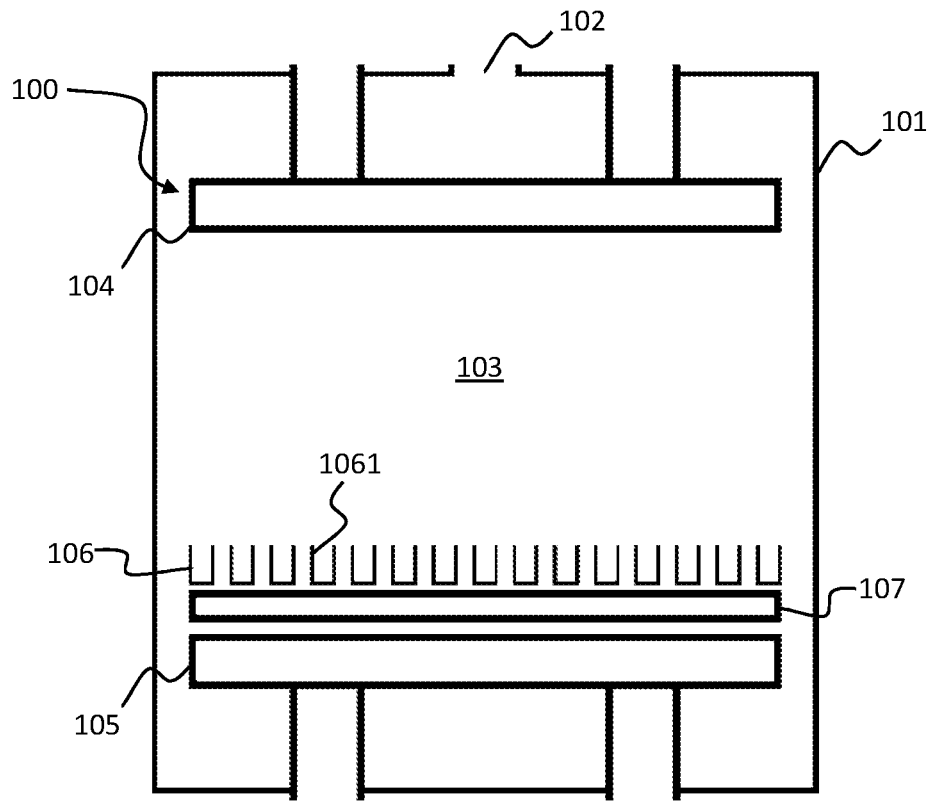
FIG. 1a shows a cross-sectional view of plasma polymerisation (PP) apparatus according to an embodiment of the present disclosure.

The production of nanoparticulate materials, described herein as "nanoP$^3$", "NanoP$^3$", "nanoP$^3$ material" or "NanoP$^3$ material", has been described in detail in PCT Publication No. WO2018/112543, the entire content of which is herein incorporated by reference.

These nanoP$^3$ materials can act as a class of versatile and multifunctional nanocarriers which may be readily functionalised. The nanoP$^3$ material can be bound to a large range of biomolecules and drugs through reaction with radicals embedded within the nanoP$^3$ material which diffuse to the surface of the nanoP$^3$ material and/or by reaction with moieties/functional groups formed on the surface of the nanoP$^3$ material, or conjugates thereof.

Processes disclosed herein, for example plasma-based processes, may be used to more effectively fabricate and collect nanoparticulate materials with advantageous and tunable physical, chemical and morphological properties that are capable of integrating multiple functionalities for a variety of nanomedicine applications.

Definitions

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

Throughout this specification, the term "consisting essentially of" is intended to exclude elements which would materially affect the properties of the claimed composition, although may include elements that do not materially affect properties.

With regards to the definitions provided herein, unless stated otherwise, or implicit from context, the defined terms and phrases include the provided meanings. Unless explicitly stated otherwise, or apparent from context, the terms and phrases below do not exclude the meaning that the term or phrase has acquired by a person skilled in the relevant art. The definitions are provided to aid in describing particular embodiments, and are not intended to limit the claimed invention, because the scope of the invention is limited only by the claims. Furthermore, unless otherwise required by context, singular terms shall include pluralities and plural terms shall include the singular.

Throughout the present specification, various aspects and components of the invention can be presented in a range format. The range format is included for convenience and should not be interpreted as an inflexible limitation on the scope of the invention. Accordingly, the description of a range should be considered to have specifically disclosed all the possible sub-ranges as well as individual numerical values within that range, unless specifically indicated. For example, description of a range such as from 1 to 5 should be considered to have specifically disclosed sub-ranges such as from 1 to 3, from 1 to 4, from 1 to 5, from 2 to 4, from 2 to 5, from 3 to 5 etc., as well as individual and partial numbers within the recited range, for example, 1, 2, 3, 4, 5, 5.5 and 6, unless where integers are required or implicit from context. This applies regardless of the breadth of the disclosed range. Where specific values are required, these will be indicated in the specification.

"About"

Herein the term "about" encompasses a 10% tolerance in any value(s) connected to the term.

"Hydrocarbon"

Hydrocarbon monomers disclosed herein are understood to be monomers consisting of hydrogen and carbon atoms only. Examples of hydrocarbons include: alkenes, alkynes, cycloalkenes, aromatic compounds, or mixtures thereof.

"Aggregate"

As used herein, the term "aggregate" shall mean a particle comprising a plurality of nanoparticulate polymers and having a size in a range of 5 nm to 100 μm, for example a size in a range of about 5 nm to about 500 nm, unless otherwise specified or clear from the context in which it is used.

"Conjugate"

Herein the term "conjugate" refers to molecules formed by the attachment of one or more compounds to a nanoparticulate polymer or an aggregate comprising nanoparticulate polymers. The "one or more compounds" may be a second species as defined herein. The attachment may be via a covalent bond or an electrostatic interaction.

"Inert Gas"

The term "inert gas" generally refers to a gas which may become activated under a set of given conditions, such as those used to prepare nanoparticulate polymers or aggregates thereof, and may undergo chemical reactions with the one or more monomers, as described herein, but which is not incorporated in the nanoparticulate polymers or aggregates thereof. Examples of inert gases include: helium, neon and argon, for example.

"Monomer"

The term "monomer" unless stated otherwise will be understood to mean a monomeric compound that can be reacted to form a polymer by means of one or more reactive functional groups that may be created by fragmentation and reaction processes in a plasma.

"NanoP³"

The term "nanoP³" refers to a nanoparticulate material having a size less than 100 micron unless otherwise specified or clear from the context in which it is used, for example the nanoP³ may have a size of between about 5 and 500 nm. Unless stated or implicit from context, the term "nanoP³" encompasses both "nanoparticulate polymers" and "aggregates" as defined herein unless otherwise specified or clear from the context in which is used. The term "nanoP³" may be used interchangeably with "nanoparticulate material". In one preferred embodiment the nanoparticulate material comprises a plasma polymer. The plasma polymer may be formed by the condensation of fragments in a plasma, said material being capable of covalently coupling one or more compounds, for example one or more "second species", including organic or organometallic species.

"Nanoparticulate Polymer"

Herein the term "nanoparticulate polymer" refers to polymers formed with monomers defined herein, wherein the nanoparticulate polymer has a particle size in the range of about 1 nm to about 50 nm. In one preferred embodiment the a nanoparticulate polymer is formed by the condensation of fragments in a plasma, said material being capable of covalently coupling one or more compounds including organic or organometallic species.

"Polymer"

The term "polymer" refers to a chemical compound or mixture of compounds consisting of repeating structural units that may be heterogeneous and/or arranged into a disordered structure, created through a process of polymerisation. Suitable polymers useful in this invention are described throughout. In one embodiment the polymer is a plasma polymer in which the repeating units are assembled into a relatively disordered structure.

"Plasma"

The term "plasma" generally refers to a (partially) ionized gas comprising a mixture of ions, electrons, neutral species and radiation. The plasmas referred to herein comprise at least one monomer.

"Plasma Polymer"

Herein a "plasma polymer" is a polymer derived from a plasma comprising one or more monomers. The plasma may also comprise one or more reactive non-polymerizable (not a monomer) gases and/or one or more inert gases.

"Reactive Gas"

Herein the term "reactive gas" generally refers to a gas which will become activated under a set of given conditions, such as those used to prepare nanoparticulate polymers or aggregates thereof, and undergo chemical reactions with the one or more monomers, as described herein.

Monomers

The nanoP³ materials described herein can be derived at least partially from one or more monomers. In one embodiment the one or more monomers are used in a gaseous form for forming the nanoP³ material.

Examples of suitable monomers are described at page 18, line 26 to page 21, line 1 of PCT Publication No. WO2018/112543, which is herein incorporated by reference.

Non-Polymerizable Reactive Gas

As indicated, the nanoP³ materials described herein can be derived from one or more monomers and one or more non-polymerizable reactive gases. In one embodiment the one or more non-polymerizable (not a monomer) reactive gases becomes activated and may react with the one or more monomers to form nanoP³. Fragments of the non-polymerizable reactive gas may be incorporated in the nanoparticulate polymers or aggregates thereof.

Examples of suitable non-polymerizable reactive gases may be a gas from group 15, 16, or 17 of the periodic table. For example, a non-polymerizable reactive gas may be nitrogen ($N_2$) gas, or oxygen ($O_2$) gas. Nitrogen as one example may be particularly suitable in ensuring reduced hydrophobicity in the resulting nanoP³ material, which may enable better dispersion of the nanoP³ material in an aqueous solution if desired. For example, the presence of nitrogen may result in the presence of amine, imine or nitrile groups, or a mixture thereof in a nanoparticulate polymer or nanoP³ material.

NanoP³

The nanoP³ material may be a homopolymer or a copolymer. In one embodiment the nanoP³ material is a homopolymer. In another embodiment the nanoP³ material is a copolymer.

In one embodiment the nanoP³ is derived from a plasma comprising one or more monomers as described herein, which are initially present in a gaseous form. One or more inert gases, for example helium, neon or argon may optionally be present with the one or more monomers, e.g., in combination with the one or more non-polymerizable reactive gases.

Examples of suitable nanoP³ materials and methods for deriving suitable nanoP³ materials are described at page 21, line 2 to page 28, line 12 of PCT Publication No. WO2018/112543, which is herein incorporated by reference.

Aggregates

Aggregates may be formed from the nanoparticulate polymers described herein during the production of the nanoP³ material.

In one embodiment the aggregate has a size in the range of about 5 nm to about 100 μm, for example about 5 nm to about 500 nm.

Conjugates

The nanoparticulate polymers, aggregates or nanoP³ materials described herein may be bound to one or more compounds, for example an organic compound, an organometallic compound, or a second species as defined herein, in order to form a conjugate.

Details of suitable conjugates and methods for deriving suitable conjugates are described at page 28, line 18 to page 40, line 6 of PCT Publication No. WO2018/112543, which is herein incorporated by reference.

Pharmaceutical Compositions

Pharmaceutical compositions may comprise a nanoparticulate polymer, aggregate, or a conjugate as defined herein, and a pharmaceutically acceptable carrier, excipient, or binder. Details of suitable pharmaceutical compositions and methods for deriving suitable pharmaceutical compositions are described at page 40, line 7 to page 44, line 26 of PCT Publication No. WO2018/112543, which is herein incorporated by reference.

Methods of Treatment

A method of treating a subject suffering from, susceptible to, or displaying one or more symptoms of a disease, disorder, or condition, may comprise a step of administering a nanoparticulate polymer, aggregate or conjugate thereof, as defined herein, or a pharmaceutical composition as defined herein, to the subject. The nanoparticulate polymers, aggregates or conjugates described herein may also be used in diagnostic tests.

Details of suitable methods of treatment and diagnostic tests are described at page 45, line 1 to page 48, line 10 of PCT Publication No. WO2018/112543, which is herein incorporated by reference.

Substrates

A nanoparticulate polymer, an aggregate, or a conjugate, as defined herein, may be comprised in a substrate.

Details of suitable substrates are described at page 48, line 11 to page 49, line 17 of PCT Publication No. WO2018/112543, which is herein incorporated by reference.

Producing NanoP³ Particles

Plasma polymerisation (PP) apparatus 100 according to an embodiment of the present disclosure is illustrated in FIG. 1*a*. The PP apparatus 100 can be positioned inside a vacuum chamber 101. The PP apparatus 100 includes at least one gas inlet 102 for providing at least one monomer in a gaseous form, and optionally one or more additional gases such as one or more non-polymerizable reactive gases, to a reaction zone 103 of the apparatus. The apparatus 100 also includes a first electrode 104, a second electrode 105 spaced apart from the first electrode 104 at opposite sides of the reaction zone 103, a plurality of collectors 106 located adjacent the second electrode 105, and a cooling device 107 located adjacent the second electrode 105. The plurality of collectors 106 may be located adjacent the second electrode 105 by being positioned in contact with, in close proximity to or even at least partially inside the second electrode 105. The cooling device 107 may be located adjacent the second electrode 105 by being positioned in contact with, in close proximity to or even at least partially inside the second electrode 105.

The PP apparatus 100 can be used for collecting plasma-polymer nanoparticulate materials formed in a reactive plasma, including nanoparticles and aggregates thereof. For example, and discussed in more detail below, nanoparticulate polymers and aggregates thereof may be formed using the PP apparatus 100 in a method comprising: providing at least one monomer in a gaseous form to the reaction zone 103; supplying power to the first electrode 104 to generate a plasma in the reaction zone and form plasma polymer nanoparticles from the at least one monomer; and collecting the nanoparticles formed in the reaction zone 103 using the plurality of collectors 106.

As indicated, at least one monomer is provided in a gaseous form to the reaction zone 103. In this regard, at least one gas comprising a monomer may be supplied to the reaction zone 103. The at least one gas supplied may comprise at least one gas that is organic (i.e., contains carbon and is not carbon dioxide). Moreover, the at least one gas supplied may comprise at least one non-polymerizable reactive gas and/or at least one inert gas. The at least one gas supplied to the vacuum chamber may be at a pressure of about 1 to about 1500 Pa absolute, for example in a range of about 6 Pa to about 67 Pa.

The non-polymerizable reactive gas may not be a monomer. The non-polymerizable reactive gas may be nitrogen ($N_2$) gas. The non-polymerizable reactive gas may be oxygen ($O_2$) gas. The non-polymerizable reactive gas may be air. The non-polymerizable reactive gas may be a gas which is reactive to the nanoparticulate material. In some embodiments, more than one non-polymerizable reactive gas may be supplied. The more than one non-polymerizable reactive gas may be a mixture of gases, for example, a gaseous mixture of argon, nitrogen and acetylene (carbon precursor). The gaseous components of the more than one non-polymerizable reactive gas may be supplied to the reaction zone 103 individually. The gaseous components of the more than one non-polymerizable reactive gas may be supplied to the reaction zone 103 as a pre-prepared mixture.

The provision of a non-polymerizable reactive gas in the gaseous mixture supplied to the reaction zone 103 may help reduce formation of hydrophobic nanoparticulate polymers and aggregates thereof that cannot be dispersed in aqueous solution, and cannot form a conjugate by the attachment of one or more compounds to a nanoparticulate polymer or an aggregate comprising nanoparticulate polymers.

The organic gas may comprise a hydrocarbon. The organic gas may comprise a carbon-carbon double bond and/or a carbon-carbon triple bond. The organic gas may be an alkene or an alkyne. The organic gas may be a mixture of such gases. The organic gas may be polymerisable under the conditions of a process according to the present disclosure. In some embodiments, more than one organic gas may be supplied.

In one embodiment the at least one gas comprises a mixture of two or more gases. One gas of the mixture may be an inert gas which is not incorporated into the nanoparticulate polymer or aggregates thereof. The at least one gas may be prepared from individual component gases before being introduced into the vacuum chamber 101 or else the individual component gases of the gas may be introduced separately into the vacuum chamber 101. In the latter case the ratio of the component gases in the at least one gas may be controlled by controlling the different flow rates of the different components. In the event that at least one of the gases comprises more than two individual components, at least one of the gases introduced into the reaction zone 103 may be itself a mixture, or else each separate component gas may be introduced discretely. Component gases include an organic gas and may also comprise one or more carrier gases, one or more non-polymerisable gases and optionally other component gases.

As illustrated in FIG. 1*a*, the first electrode 104 and second electrode 105 of the PP apparatus 100 are spaced apart and configured to generate an electric field in the reaction zone 103 to form plasma polymer nanoparticulate materials, such as nanoparticles and/or aggregates thereof, from the at least one monomer in a gaseous form. The distance between the first electrode 104 and second electrode 105 may be from about 5 to about 60 cm, for example. In some embodiments, the apparatus 100 may comprise a linear motion device capable of moving the first and/or second electrode 104, 105 to change the distance between the first and second electrodes 104, 105.

The first electrode 104 may have a radius, for example, from about 4 cm to about 19.9 cm, and a depth from about 0.5 cm to about 5 cm. The first electrode 104 and/or the second electrode 105 may be made from, for example, stainless steel (for example 304 or 316L), aluminium, or graphite.

Power may be applied to the first electrode 104, second electrode 105 or to both electrodes. In some embodiments, the first electrode 104 is connected to a power supply, and the second electrode 105 can be electrically insulated and allowed to acquire a floating potential determined by charging of the electrode in the discharge in the reaction zone 103, or connected to a pulsed high voltage power supply.

The power applied to the first electrode 104 should be sufficient to generate and sustain a plasma discharge in the reaction zone 103. It should be sufficient to fragment, dissociate or ionize a gas, for example a mixture of hydrocarbon gas, reactive non-polymerisable gas and an additional gas, such as nitrogen, fragments of which may be incorporated into the resulting polymeric material. It should be sufficient to produce radical species in the plasma discharge in the reaction zone 103 resulting from the dissociation and fragmentation of the gas. It should be sufficient to sustain a plasma discharge in the reaction zone 103 during the formation of the nanoparticulate material in the reaction zone 103.

In some embodiments, the power supply connected to the first electrode 104 may supply the first electrode 104 with a radio frequency (rf), or DC, or pulsed radio frequency, or pulsed DC power to generate and sustain the plasma within a reaction zone 103. For example, during plasma generation, an rf frequency may be supplied to the first electrode 104 at about 1 to about 200 MHz, and with a power of about 5 to about 500 or about 5 to 3000 W. As another example, a pulsed bias voltage may be supplied to the first electrode 104 with a frequency of about 1 Hz to about 50 kHz, and a pulse duration from about 1 to about 150 microseconds. The ratio between off time and on time of the pulses may be from about 10 (i.e., 10:1) to about 20. The bias voltage may be from about −1000V to about 1000 V. In some embodiments the bias voltage is non-zero. It may therefore be either positive or negative and in each case may have an absolute value of from 10 to 1000.

During plasma generation the pressure within the reaction zone 103 or vacuum chamber 101 may be between about 7.5 mTorr to about 115 mTorr (about 1 to about 1500 Pa absolute) or about 7.5 mTorr to about 760 mTorr (about 1 to about 101325 Pa absolute). To attain the desired pressure, the vacuum chamber 101 may initially be evacuated to below this pressure, for example below about 10 mPa. The desired pressure is then achieved by allowing the gas, or its individual component gases, to bleed into the vacuum chamber 101 and reaction zone 103 through the gas inlet 102 at a sufficient rate, which is adjusted together with the pumping speed, to attain the desired pressure and the desired monomer residence time in the reaction zone 103. The residence time of the gas molecules, the pressure, the gas flow rate and the power coupled to the plasma in the reaction zone 103 determines the degree of fragmentation of the monomer and other gas molecules in the plasma. It will be understood that the required flow rate will depend on the size of the vacuum chamber 101; however, by monitoring the pressure within the vacuum chamber 101 (e.g., by means of a pressure gauge coupled to the internal space of the vacuum chamber 101), it may be possible to adjust the flow rate(s) and pumping speed to achieve the desired pressure and gas residence time. The flow rate of the at least one gas (or the sum of the flow rates of all gases) may be from about 0.1 to about 4000 sccm (standard cubic centimetre/minute). The flow rate of the carrier and reactive non-polymerisable gas(es) may then be adjusted to achieve the desired pressure within the vacuum chamber 101 and residence time within the reaction zone 103.

It will be appreciated that any of the flow rate, pressure and power may be varied according the specifically desired properties of the plasma-polymer nanoparticulate materials formed in the reaction zone 103. Thus, any of the numerical values or ranges exemplified herein for each of the flow rate, pressure and power may be used together, in any combination. For example, in one embodiment, a flow rate of from about 0.5 to about 10 sccm, a pressure of about 20 Pa and a power of about 50 W to about 100 W may be used. All other possible combinations are envisaged herein.

In one embodiment of the present disclosure, the first electrode 104 is connected to a radio-frequency (rf) power supply and the second electrode 105 is allowed to float and attain a floating potential determined by its spontaneous charging in the discharge in said reaction zone 103.

The plasma-polymer nanoparticulate materials formed in a reactive plasma as described above may be collected using a plurality of collectors. Each collector 1061 of the plurality of collectors 106 may be fixed to each other or may be independently movable. Each collector may be three-dimensionally shape and may define a recess or receiving portion. The plurality of collectors 106 may be removable from the reaction zone 103 and vacuum chamber 101, e.g. by being comprised in or positioned on a removable plate. Referring to FIG. 1a, in this embodiment, the plurality of collectors 106 are disposed between the first electrode 104 and the second electrode 105, and configured to collect plasma-polymer nanoparticulate materials formed in the reaction zone 103.

When the collectors 1061 of the plurality of collectors 106 are fixed to each other or otherwise, the plurality of collectors 106 may have a structure with an outer shape that is circular, square, oval, rectangular, triangular, pentagonal, hexagonal, etc., or substantially circular, substantially square, substantially oval, substantially rectangular, substantially triangular, substantially pentagonal, substantially hexagonal, etc. The structure may be a n-sided polygonal base. Examples include a rectangle, square (n=4), parallelogram ($\Sigma 2n_1=4$; i=i1,2), pentagon (n=5), hexagon (n=5), etc. The length of a side n may range from about 1 cm to about 50 cm. For example, the plurality of collectors 106 may be comprised in a rectangular tissue culture plate with dimensions 127.89×85.60 mm (i.e., an overall area of 108 cm$^2$; side $n_1$=127.89 mm and $n_2$=85.60 mm).

Figure 2A:
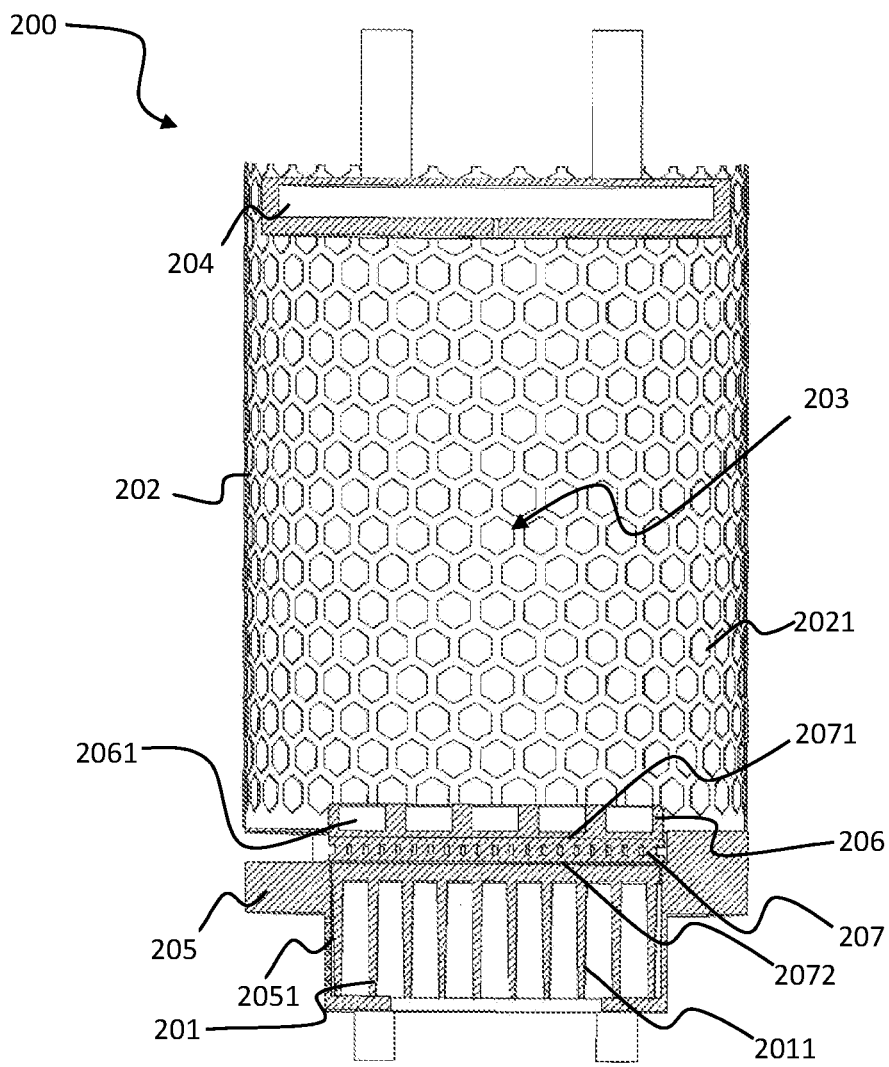

In one embodiment, the plurality of collectors 106 comprises a plurality of vials 1061, e.g. as shown in FIG. 1a. Alternatively or in addition, a plurality of collectors 206 may comprise a plurality of wells 2061, e.g. as shown in FIG. 2a, which shows plasma polymerisation (PP) apparatus 200 according to another embodiment of the present disclosure that functions in a similar manner to that described above with reference to FIG. 1a. For example, the plurality of collectors 206 may comprise a plurality of wells 2061 formed in a collector (well) plate 206, which collector plate 206 may be removable from a reaction zone 203.

The shape and size of each individual collector 1061, 2061 whether provided by vials, wells or otherwise, is important since it controls particle agglomeration. The size and shape of each collector (or at least a recess or receiving portion thereof) may be chosen based on the desired size and yield of a nanoparticulate material. In some aspects of the present disclosure the collectors, e.g. the vials and/or wells (or at least a recess or receiving portion thereof) may each have a depth of from about 2 to about 20 mm. In some instances the vials and/or wells may each be deeper than 20 mm. By way of example, where the vials or wells are generally circular, a radius of one or more vials or wells may be from about 1 mm to about 50 mm. The ratio of the height to the radius of each vial or well may be tailored according to the desired size and yield of nanoparticulate material. In one example, the ratio of the height to the radius of a well is from about 5:1 to 0.1:1.

In the apparatus illustrated in FIG. 2, which has a plurality of circular wells 2061, each well 2061 may have a height from about 8.00 mm to about 17.40 mm. Each well 2061 may have a radius from about 3.43 mm to about 8.13 mm. For example, a well may have height=17.40 and radius=8.13 mm; or height=10.67 and radius=3.43 mm; or a height=8.00 and radius=7.00 mm.

The plurality of collectors 106, 206 may be sealable. Thus, the vials or wells 1061, 2061 may be sealable, individually or collectively. Since exposing each vial or well to a plasma effectively sterilises it, collecting the nanoparticulate material directly in each vial or well may provide a convenient way to both collect and sterilise the vial or well in a single step. The collector may be made of a non-conducting material or it may be made of a conducting material. It may be made of a material capable of withstanding a plasma. It may, for example, be made of stainless steel, aluminium, copper, low degassing polymers such as polystyrene, high-density polystyrene, acrylonitrile butadiene styrene, polycarbonate, polyethylene (including high-density polyethylene, low-density polyethylene), polypropylene, polyamides, polyacetylene, polypropylene, glass (silica-silicon dioxide), quartz and/or silicon (semi conductive crystalline wafers).

Nanoparticles formed in the apparatus 100, 200 experience thermophoretic forces due to temperature gradients within the reaction zone 103, 203. The thermophoretic forces arise from a higher momentum efficiency between the plasma/gas species and the particles in higher temperature regions. The present inventors have determined that temperature gradients can be used, advantageously, to push the particles in the reaction zone 103 from hotter to colder regions. In particular, temperature gradients can be adjusted to control movement of the particles towards and into the plurality of collectors 106, 206. In the present embodiments, suitable temperature gradients are generated by cooling the plurality of collectors 106, 206. Large temperature gradients can be obtained by cooling the plurality of collectors 106, 206 to a temperature that is significantly lower than the plasma/gas temperature in the reaction zone 103, 203. For sufficiently large temperature gradients, the thermophoretic force can outperform ion and gas drag forces experienced by the particles. Ultimately, this can result in higher nanoparticle yields in the plurality of collectors 106, 206 and can result in a broadening in the range of particle sizes that may be collected. For example, it can enable, for a broader range of particle sizes, the net dragging forces (i.e. the sum of gas drag, ion drag and thermophoretic forces) that push the particles towards the plurality of collectors to outperform any confining electrostatic forces.

Referring to FIG. 1, cooling can be achieved, for instance, by thermally coupling the plurality of collectors 106 to a cooling device 107, e.g. by placing one or more surfaces of the plurality of collectors, or other structure that comprises the plurality of collectors, in direct contact with a cooling surface of the cooling device 107, or in contact via a heat transfer medium. The cooling device 107 may comprise a single cooling device or an array and/or a cascade of cooling devices, such as thermoelectric semiconductor devices, e.g. one or more Peltier semiconductor elements. The cooling device 107 may be disposed between the first electrode 104 and the second electrode 105. The cooling device 107 may be disposed between the plurality of collectors 106 and the second electrode 107. The cooling device 107 may be capable of cooling at least a portion of each collector 1061 below the temperature of the plasma during the synthesis of nanoparticulate materials in the reaction zone 103. The cooling by the cooling device 107 may cool walls of each collector 1061.

In one embodiment, thermal coupling between the plurality of collectors 106 and the cooling device 107 may be achieved through a vacuum-compatible high thermal conductivity thermal paste or pads positioned between the plurality of collectors 106 and the cooling device 107. The area of the cooling surface of the cooling device 107 may be the same as the area of the surface of the plurality of collectors 106 that is coupled to the cooling device 107.

When a plurality of cooling devices are provided, e.g. in an array or cascade, thermal coupling between adjacent cooling devices may also be provided to ensure an efficient heat transfer between. Coupling between cooling devices array may also be achieved through vacuum-compatible high thermal conductivity (e.g., 3 W/mK, 6 W/mK, 12 W/mK or higher) thermal paste or pads.

As indicated, the cooling device 107 may comprise at least one Peltier element. In some instances, the surface area of the largest commercially available Peltier element may be smaller than the surface of the plurality of collectors that is cooled (e.g. 100×100 mm). In this situation, an array of Peltier elements may be used to provide uniform cooling throughout the entire collector.

Figure 1B:
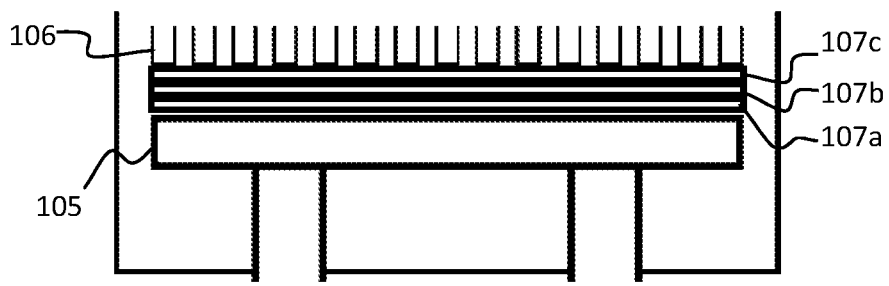

The Peltier elements may operate in a voltage range between about 2 V and 30 V, for example, and draw a total current between about 2 A and 40 A, for example. The maximum temperature difference between a "hot side" and a "cold side" of the Peltier element may range from 1° C. to 80° C. For Peltier elements stacked in cascade, the applied voltage to the bottom element (furthest from the plurality of collectors) may be higher than the top element (closest to the plurality of collectors). In one embodiment, where two elements are stacked in cascade, the voltage applied to the bottom element may be 12 V and the voltage applied to the top element may be 5 V. In another embodiment, where three elements are stacked in cascade, as represented in FIG. 1b, which shows a portion of the apparatus 100 of FIG. 1a with a modified cooling arrangement, the voltage applied to the bottom element 107a may be 12 V, the voltage applied to the middle element 107b may be 5 V and the voltage applied to the top element 107c may be 3.3 V.

Figure 2B:
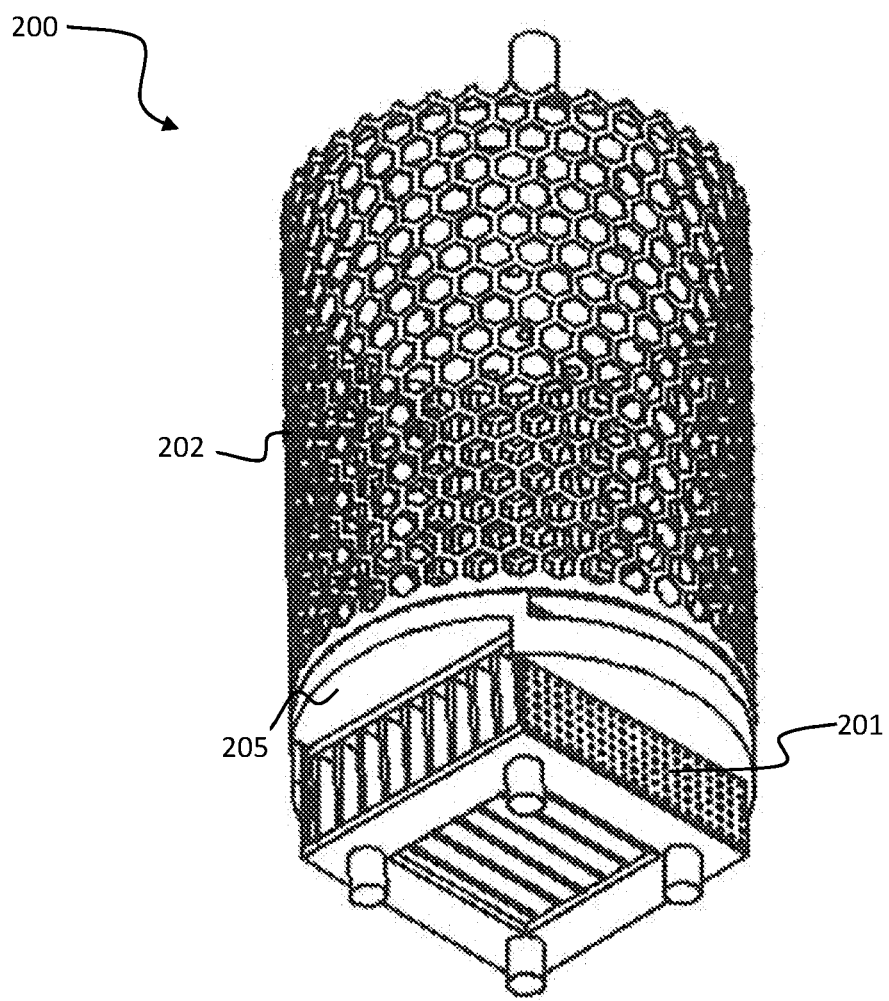

Referring to FIGS. 2a and 2b, in one embodiment, the cooling device 207 may be an array of thermoelectric semiconductor devices, such as Peltier devices, which are thermally coupled to the rear surface of a collector plate 206, the collector plate comprising a plurality of wells 2061. The cool side 2071 of the cooling device 207, which is adjacent to and faces the collector plate 206, cools the collector plate 206. The temperature of the collector plate 206 may be stabilized and maintained constant by providing for efficient heat dissipation on the opposite, hot side 2072 of the cooling device 207. Efficient dissipation of the heat generated by the hot side 2072 of the cooling device 201 may be achieved with a heat exchanger 201, which may be thermally coupled with the cooling device 207. The heat exchanger 201 may comprise a passive component such as a heatsink, e.g. as illustrated in FIGS. 2a and 2b. The heat sink may comprise a large surface area, e.g. through comprising a plurality of fins 2011.

Additionally or alternatively, the heat exchanger may comprise an active component such as a closed cooling loop that constantly flows a heat transfer fluid (e.g. water, liquid nitrogen, helium) through a metal pipe (formed e.g. of copper or stainless steel) in contact with the hot side 2072 of the cooling device 207.

Additionally or alternatively, the heat sink may comprise an active component for enhanced heat dissipation, for example a fan and/or copper heat pipes. In one embodiment, by way of example, an extension portion of the heatsink is configured to extend outside of a vacuum chamber in which the apparatus 200 is located. A fan may be coupled to the portion of the heatsink extended outside of the vacuum chamber.

As illustrated in FIG. 2, in some embodiments the second electrode 205 comprises a recess 2051 in which one or more of the following is at least partially received: the cooling device 207, the collector plate 206 and the heat exchanger 201. For example, in accordance with the embodiment illustrated in FIG. 2a, at least the cooling device 207 may be completely housed in the recess 2051. The recess may be open on one side to at least partially receive the collector plate 206.

As illustrated in FIG. 2a, PP apparatus 200 according to the present disclosure may further comprise a confinement means such as a confinement grid 202. The confinement grid 202 may extend between the first electrode 204 and the second electrode 205. The confinement grid 202 may be earthed or allowed to acquire a potential determined by charging of the confinement grid upon exposure to the plasma. In this regard or otherwise, the confinement grid 202 may be considered to provide a third electrode. The confinement grid 202 may substantially confine the plasma between the first electrode 204 and the plurality of collectors 206 by confining the electric field. The confinement grid 202 may inhibit plasma lateral expansion and diffusion towards walls of the surrounding vacuum chamber. In some embodiments, the confinement grid may also confine and/or define the reaction zone 203. Since the nanoparticulate materials formed in the plasma are confined by the positive plasma potential of the reaction zone 203, particle loss may be significantly inhibited by confining the reaction zone 203 (and ultimately the plasma and nanoparticulate materials) within boundaries defined by the confinement grid 203.

The confinement grid 203 may comprise a mesh with a plurality of openings 2021, e.g., as shown in FIG. 2a. Each opening in the mesh may have, for example, a maximum dimension of between about 50 µm and 5 mm. By way of example only, the openings 2021 in the mesh of confinement grid 203 may be substantially circular, square, oval, rectangular, triangular, pentagonal, hexagonal. In combination, the openings may provide a circular, rectangular, honeycomb or triangular mesh confinement structure, for example. Each opening 2021 may be uniform in shape and/or size. Alternatively, differently shaped and/or sized openings may be provided.

The confinement grid 203 may be made of a conducting or a non-conducting material. The confinement grid 203 may be made of a material capable of withstanding a plasma. The confinement grid 203 may, for example, be made of stainless steel, aluminium, and/or copper. The confinement grid 203 may have an overall structure that is tubular or part-tubular. A cross-section of the confinement grid 203, e.g. in its width direction across a plane perpendicular to an axis extending between the first and second electrodes 204, 205, may be substantially circular, square, oval, rectangular, triangular, pentagonal, hexagonal. For example, as evident from FIGS. 2a and 2b, the cross-section is circular and thus the confinement grid 203 has a substantially cylindrical structure.

The confinement grid 203 may have a maximum width of from about 5 cm to about 20 cm. The confinement grid 203 may have a maximum width that is substantially the same as or greater than a maximum width of the first and/or second electrodes 204, 205.

A length of the confinement grid 203, extending between the first and second electrodes 204, 205, may be from about 3 cm to about 30 cm, for example. The confinement grid 203 may have a length that is substantially the same as or greater than the distance between the first and second electrodes 204, 205.

Configurations described herein may enable PP apparatus 100, 200 to enhance the collection of plasma-polymer nanoparticulate materials formed in a reactive plasma. As one example, process yield may be enhanced by the increased thermophoretic force when the plurality of collectors 106, 206 are cooled by the cooling device 107, 207, causing a greater number of particles to experience a net dragging force, in the reaction zone 103, 203 towards the plurality of collectors 106, 206. The enhancement of yield may be further realised by confining the plasma boundaries of the reaction zone 103, 203 using the confinement grid 202.

Although not illustrated in FIGS. 1 and 2, PP apparatus 100, 200 according to the present disclosure may comprise a controller 301 for controlling the cooling applied by the cooling device 107, 207. Through controlling of the cooling, the controller may in turn control the yield and/or the properties of particles collected by the plurality of collectors 106, 206.

Figure 3:
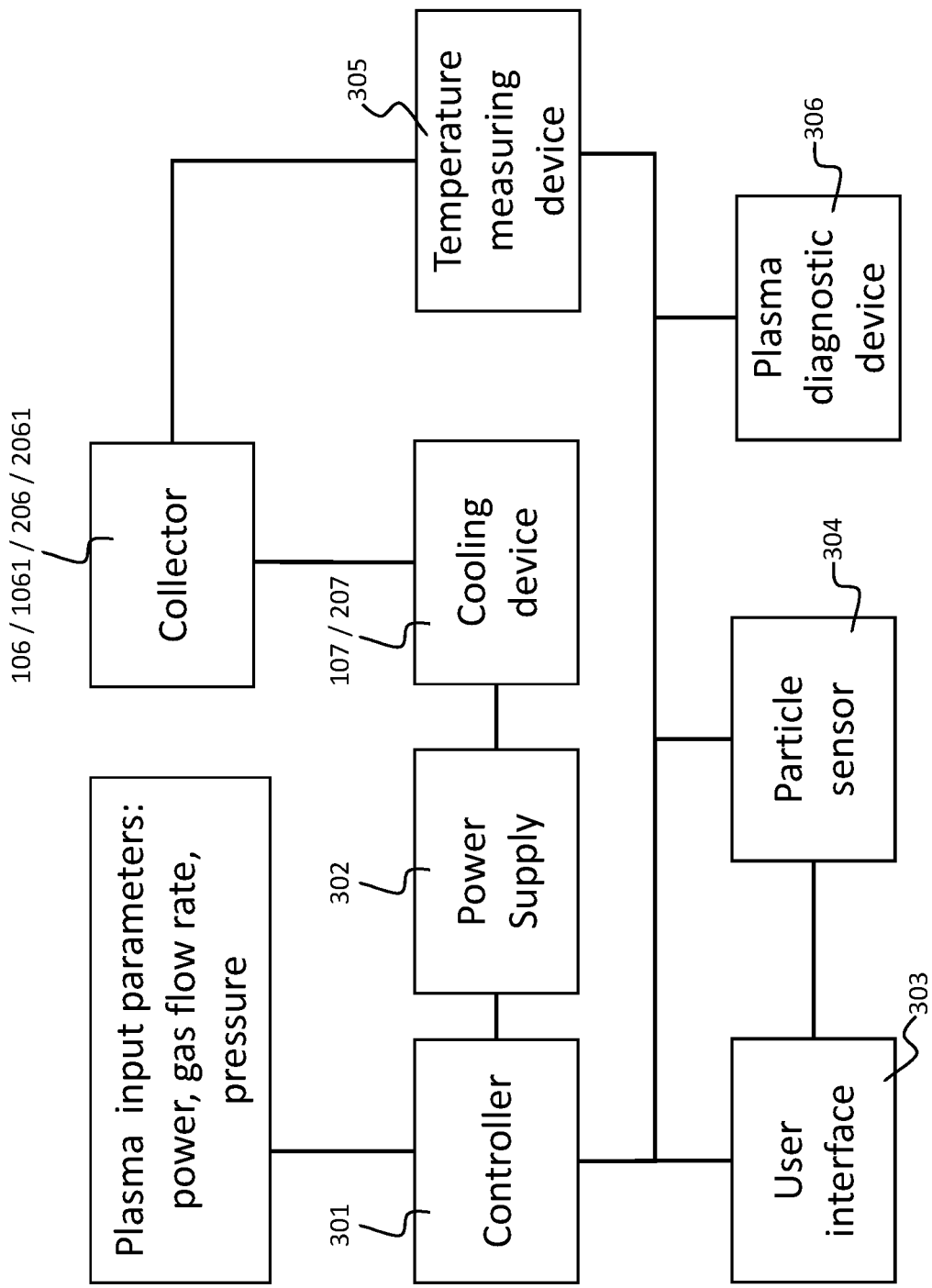
FIG. 3 shows a schematic illustration of electronic components of a controller for controlling plasma process input parameters and cooling applied by a cooling device of the PP apparatus of FIGS. 1a, 1b and 2.

In one example, as illustrated in FIG. 3, the controller 301 may control the degree of cooling applied by the cooling device 107, 207 by adjusting a power (e.g. voltage) supplied to the cooling device 107, 207 by a power supply 302. The controller 301 may adjust the power based on an input from a user interface 303 and/or based on an input from a particle sensor 304 and/or based on an input from a temperature measuring device 305 and/or based on an input from a plasma diagnostic device 306.

The user interface 303 may comprise one or more buttons, dials, keyboards, touch-sensitive screens or otherwise, through which a user may select desired particle properties.

The particle sensor 304 may comprise, for example, a scanner that scans particles located in the plasma, reaction zone 103, 203 and/or plurality of collectors 106, 206. The particle sensor 304 may comprise, for example a camera that detects the intensity and spatial distribution of light emitted from a laser source scattered on the nanoparticulate materials. The temperature measuring device 305 may comprise, for example, a thermocouple in contact with the plurality of collectors 106, 206 or individual wells/vials 1061, 2061. The plasma diagnostic device 306 may comprise an array of Langmuir probes to measure relevant plasma output parameters, such as electron temperature and density, at different locations in the reaction zone, e.g. in the vicinity of the plurality of collectors 106, 206. Additionally or alternatively, the plasma diagnostic device 306 may comprise an optical spectrometer (or monochromator) coupled to an intensified charge-coupling device image sensor and an optic fibre to collect the radiation emitted by the plasma at different locations in the reaction zone 103, 203. The discharge emission intensity can oscillate during formation, growth and removal of nanoparticulate materials in a reaction chamber, as described, for example, in page 72, line 19 to line 28, page 79, line 3 to page 80, line 27 and FIGS. 5, 6, 11-15, 17 and 18 of PCT Publication No. WO2018/112543. The period and relative intensity of the oscillations are related to the nanoparticle chemistry, size and yield. Therefore, the particle sensor 304, the temperature measuring device 305 and/or the plasma diagnostic device 306 may be used to calculate, for example, current particle properties of the particles produced using the apparatus and, depending on any differences between the current particle properties and desired particle properties, the controller 301 may adjust the cooling, the power coupled to the plasma, the flow rate of the monomer and/or other gases and/or the pressure inside the reaction chamber e.g., automatically. In this regard, the apparatus may include a feedback loop that adjusts the plasma input parameters (coupled power, gas flow rates and/or discharge pressure, etc.) to adjust the particle properties and/or adjust the particle yield and thermophoretic force using cooling control based on the sensed particle properties, plasma diagnostics and/or the temperature measurement on the plurality of collectors.

Particle properties may include individual, average or mean size of nanoparticles or aggregates of nanoparticles, number of nanoparticles or aggregates of nanoparticles or the chemistry of nanoparticles or aggregates of nanoparticles, for example.

The controller 301 may comprise a processor. The processor as disclosed herein may comprise a number of control or processing modules for controlling one or more functions of the apparatus and methods and may also include one or more storage elements, for storing data, e.g., scan data, desired particle properties or otherwise. The modules and storage elements can be implemented using one or more processing devices and one or more data storage units, which modules and/or storage devices may be at one location or distributed across multiple locations and interconnected by one or more communication links Processing devices that are used may be located in desktop computers, laptop computers, tablets, smartphones, personal digital assistants and other types of processing devices, including devices manufactured specifically for the purpose of carrying out functions according to the present disclosure.

Further, the processing modules can be implemented by a computer program or program code comprising program instructions. The computer program instructions can include source code, object code, machine code or any other stored data that is operable to cause the processor to perform the steps described. The computer program can be written in any form of programming language, including compiled or interpreted languages and can be deployed in any form, including as a stand-alone program or as a module, component, subroutine or other unit suitable for use in a computing environment. The data storage device(s) may include suitable computer readable media such as volatile (e.g., RAM) and/or non-volatile (e.g., ROM, disk) memory or otherwise.

Example 1—Collector Geometry Controls Particle Agglomeration

Figure 4:
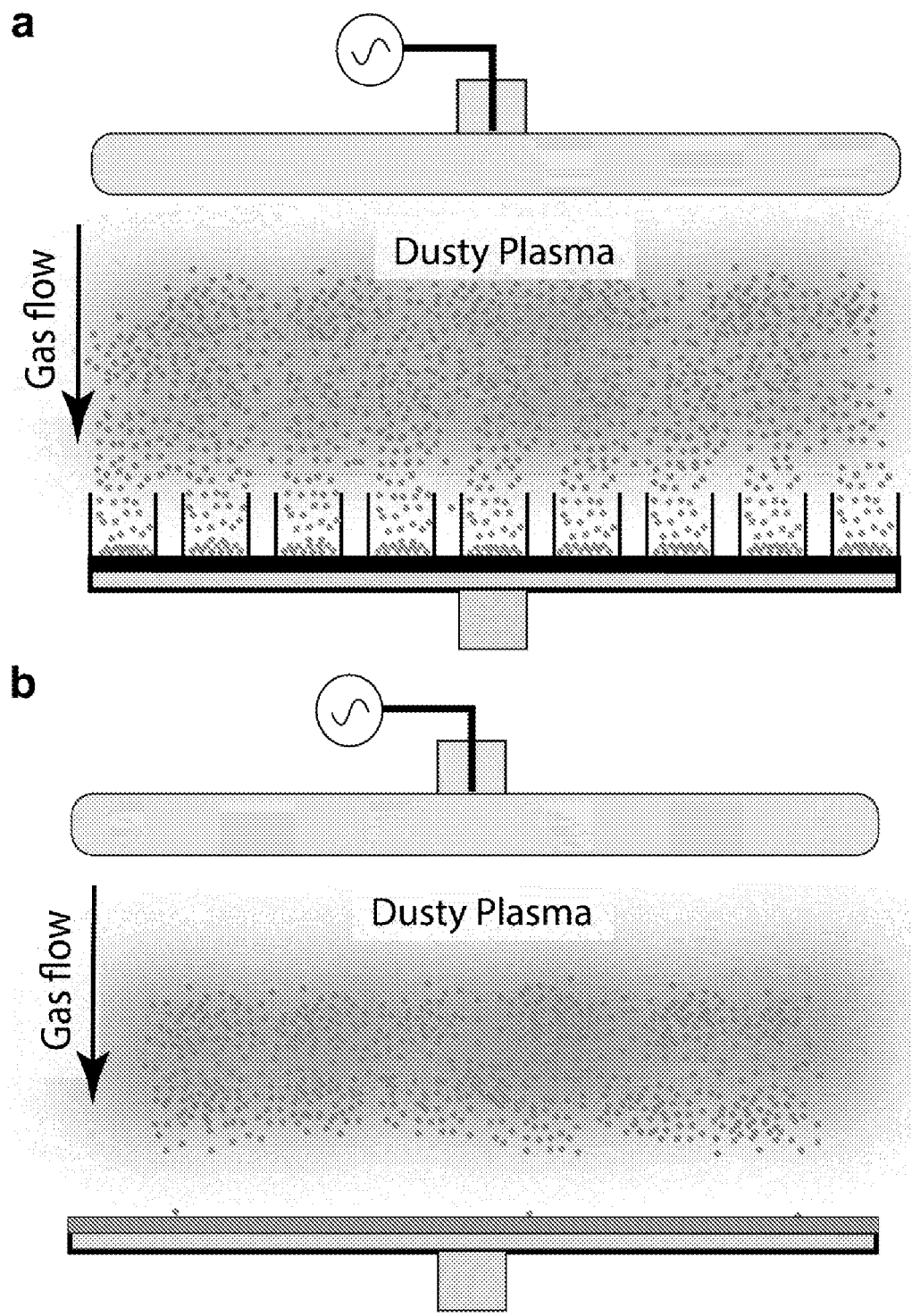
FIG. 4a shows a schematic illustration of the collection of PPN in dusty plasmas using a three-dimensional collector (a removable well plate comprising a plurality of wells) using a PP apparatus according to an embodiment of the present disclosure; a traditional 2-dimensional collector (i.e., without wells) is illustrated in FIG. 4b for comparison.

To exemplify collection of plasma polymer nanoparticles or nanoparticulate materials (PPN) in $C_2H_2/N_2/Ar$ capacitively coupled radiofrequency dusty plasmas, a plurality of wells, comprised in a removable well plate was used (in accordance with that described in PCT Publication No. WO2018/112543). The well plate was placed on top of a floating substrate holder (second, bottom electrode) to entrap PPN falling within the boundaries of each well (FIG. 4a). For the purpose of comparison, experiments were also carried on stainless steel (SS) sheets without the wells as shown in FIG. 4b, enabling a direct comparison with samples obtained under a traditional flat (2-dimensional) substrate geometry, which is widely adopted in the deposition of plasma polymer coatings. A traditional 2-dimensional geometry (without wells), as illustrated in FIG. 4b, typically yields plasma polymer materials in the form of thin-film coatings (for example, see Santos et al. 2016, ACS Applied Materials & Surfaces). The use of a three-dimensional well plate collector has been shown to achieve significantly increased PPN yields, compared with traditional 2-dimensional collectors, and the well aspect ratio in well plate collectors has also been shown to modulate PPN aggregation, size, and polydispersity index (see PCT Publication No. WO2018/112543). The collection efficiency of different well plates was first exemplified using 8.5 cm×12.7 cm polystyrene tissue culture plates, containing 24 wells distributed in a well matrix of 4 rows (A-D)×6 columns (1-6). The depth and surface area of each well was 1.7 cm and 2 $cm^2$ respectively. Exposure of the well plate to the dusty plasma for 7 minutes (corresponding to 5 complete PPN growth cycles) resulted in a significant change in the plate appearance by the deposition of a powder-like brown material. High resolution secondary electron images of the as-synthesised nanoparticles were taken. For the purpose of imaging the samples using scanning electron microscopy (SEM), the plasma was set to run for a single growth cycle (i.e. 80 s) so as to avoid superimposition of multiple generations of nanoparticles. The resulting SS surface was covered by a large number of spherical nanoparticles featuring a cauliflower-like surface topography. The nanoparticles were uniformly distributed throughout the sheets, covering 29% of the sheet surface and mostly arranged in aggregates formed by the assembly of 3 to up to 20 particles. Interestingly, the formation of a coating was not observed on surfaces placed inside the plate collector, suggesting that surface polymerization does not occur on the bottom of the wells. This collection method thus yielded pure nanoparticle samples free of coatings. In contrast, plasma polymer coatings are typically (for example, see Santos et al. 2016, ACS Applied Materials & Surfaces) obtained under the same discharge parameters on SS sheets placed on the substrate holder in a flat configuration (i.e. without the plate collector). The diffusion and subsequent surface polymerization of active species from the plasma rendered a uniform gold-coloured coating on the substrate. The coating morphology suggested that surface plasma polymerization occurs in localized islands that subsequently merge and conformally cover the underlying substrate. Nanoparticle deposition on the flat substrates was virtually negligible, covering less than 1% of the surface.

Figure 5:
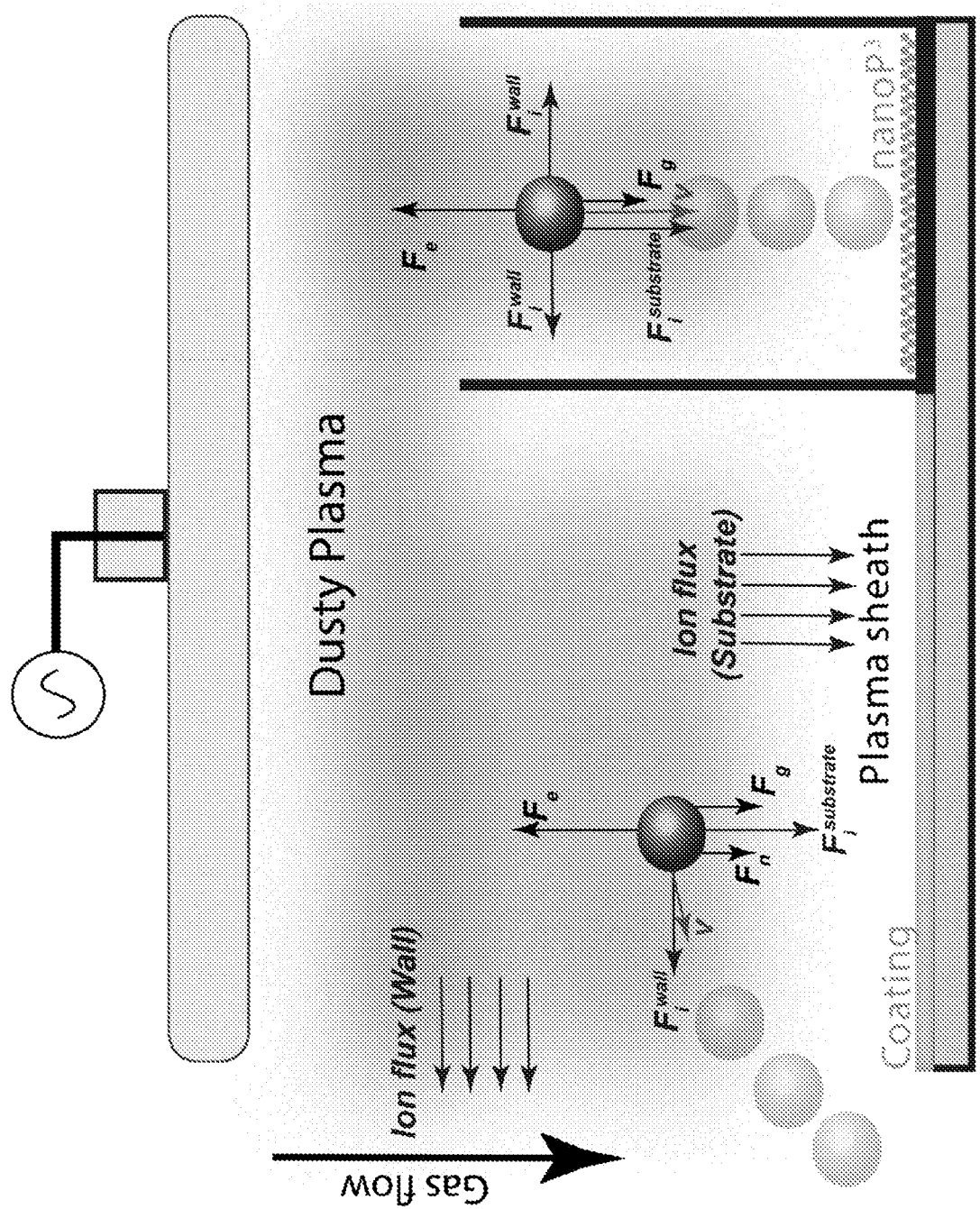
FIG. 5 shows a schematic comparison of the dynamics of PPN in the presence of flat two-dimensional (left) and well-type three-dimensional collector (right)

The forces understood to be acting on PPN outside and inside the collector wells during synthesis are illustrated in FIG. 5. For PPN in the presence of a flat two-dimensional collector (left hand side of FIG. 5), PPN levitate in vertical equilibrium positions near the plasma sheath above the flat substrate. The net ion drag force (with a horizontal component) due to the ion flux towards the chamber's walls drag the particles outside the substrate region, resulting in the deposition of a coating with a low number of particles. In contrast, for PPN in the presence of a well-type 3D substrate, e.g., a well plate (see FIG. 5, right hand side) PPN are dragged inside the well due to expansion of the plasma. The net drag force (with a vertical, downwards component) drags the trapped particles towards the bottom of the wells. No coating is deposited on the bottom of the well.

Figure 6:
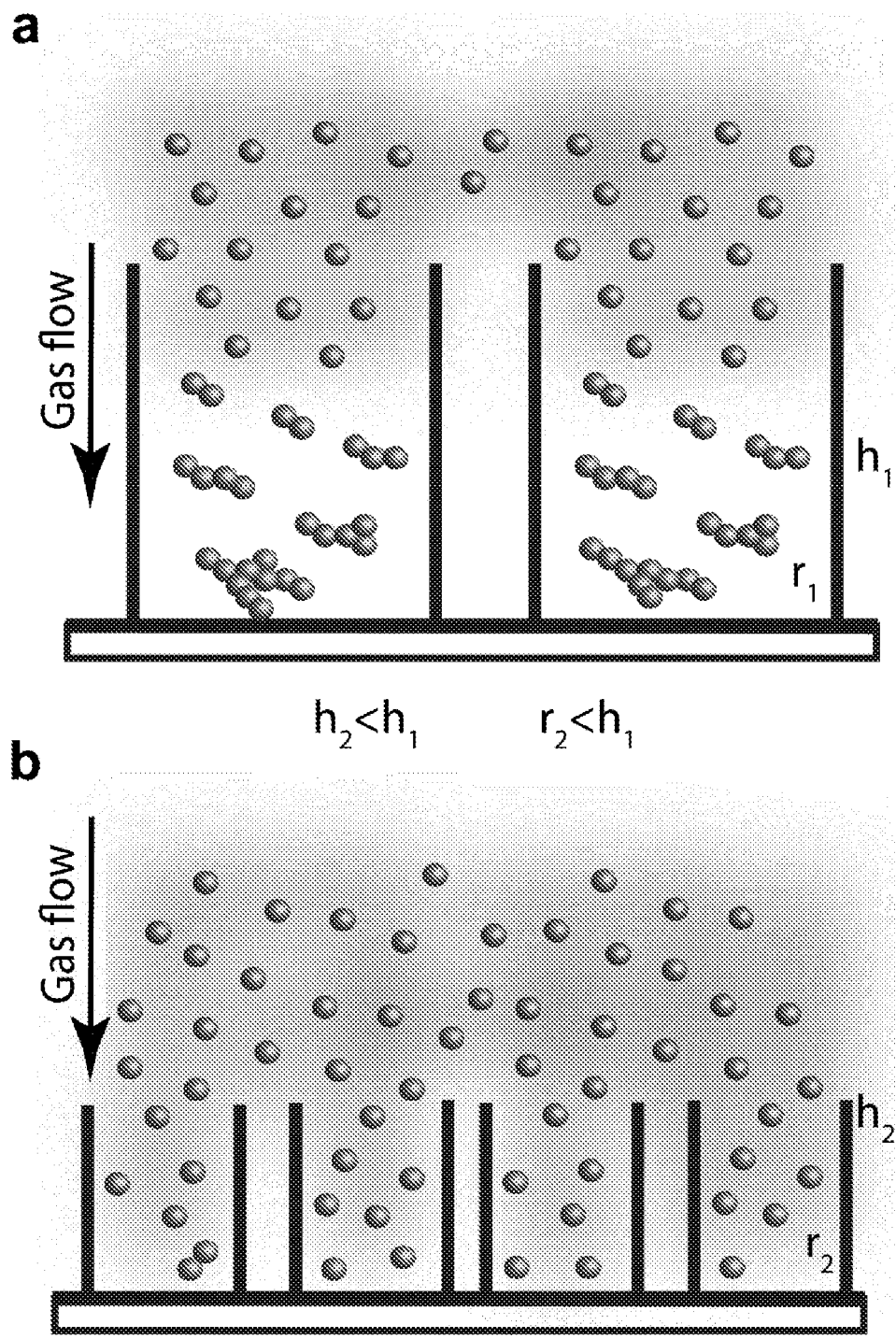
FIGS. 6a and 6b show a schematic comparison of PPN aggregation using a plurality of collectors according to an embodiment of the present disclosure with different aspect ratios, indicating particle aggregation is inhibited in shorter wells.

FIG. 6 illustrates how the ratio of the height (h) to the radius (r) of each vial or well affects the plasma distribution within each well which then modulates PPN aggregation. On higher wells (FIG. 6a) the plasma is unable to expand the entire length of the well and PPN particles aggregate due to a reduction of their surface charge as they are continuously dragged towards the bottom of the well outside the plasma region. Aggregation of PPN particles is significantly inhibited when the length of the well is decreased (i.e., shorter well) as the plasma is able to expand through the height of the well (FIG. 6b). Thus, the dimensions of the collector can be varied in order to produce nanoparticles and aggregates of a preferred size.

Example 2—Cooling Apparatus for Enhanced Nanoparticle Yield Using 3D, Multi-Collector, Plate Collection of plasma polymer nanoparticulate materials or nanoparticles (PPN) was performed in a similar manner to Example 1, except for the addition of active cooling devices, generally in accordance with embodiments described herein with reference to FIGS. 1a, 1b, 2a and 2b.

PPN in a plasma can exhibit thermophoresis, that is, the phenomena whereby nanoparticles within a gas exhibit different responses to the thermophoretic force ($F_t$) that arise from a higher momentum efficiency between the plasma/gas species and the particles in higher temperature regions.

Different temperature gradients were achieved by thermally coupling the well plate to different configurations of Peltier elements, including a single Peltier elements and two Peltier elements installed in a cascade configuration (stacked on each other), along with different heat exchanger configurations.

Figure 7:
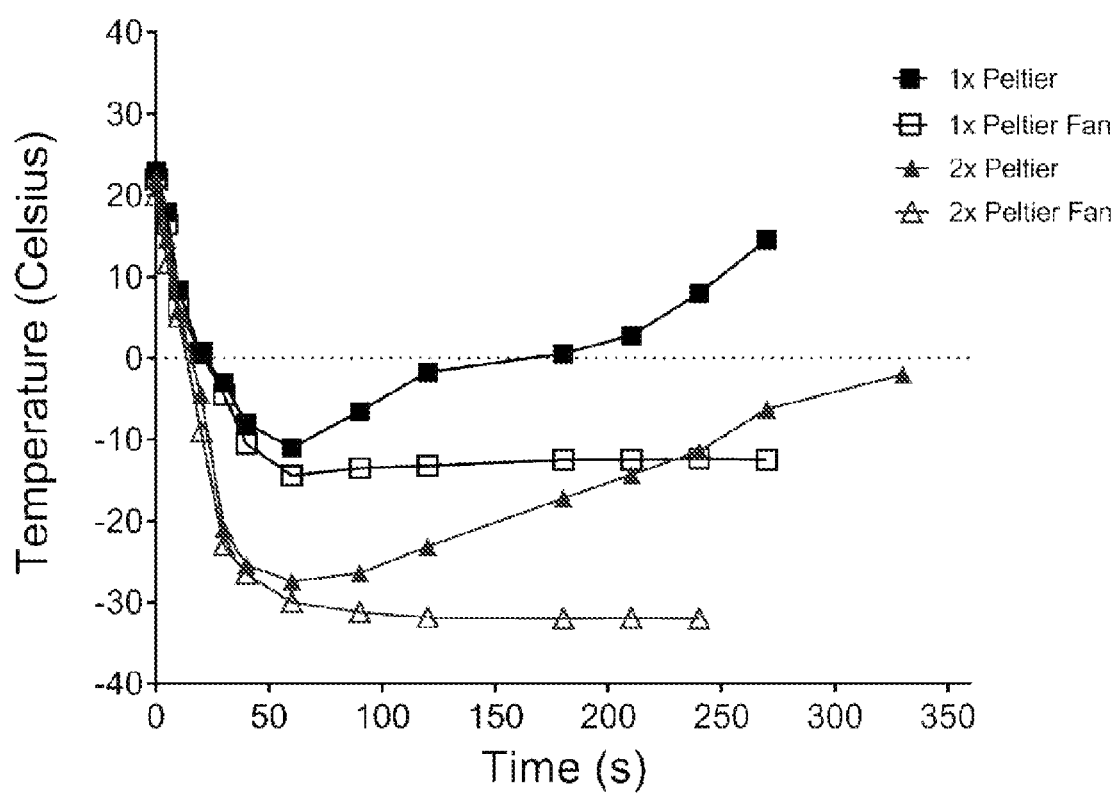
FIG. 7 shows a plot of temperature profiles measured on a removable plate (well collector) when thermally coupled to both a single Peltier element and double Peltier elements installed in cascade, and a heat exchanger thermally coupled to the Peltier elements. Further, a comparison in temperature stability is shown for the single and double Peltier element configurations when a fan was used to dissipate the heat accumulated by the heat exchanger.

FIG. 7 shows the different temperature profiles measured on the surface of the plate using both a single Peltier element and double Peltier elements installed in cascade. The heat exchanger thermally coupled to the Peltier element(s) was equipped with copper heat pipes to assist heat dissipation. The voltage applied to the Peltier element (in single configuration) was 12V, drawing a maximum current of 10 A. The voltage applied to the top Peltier element (thermally coupled with the well collector) in a double cascade configuration was 5V, drawing a total current of 4 A and the voltage applied to the bottom Peltier element (thermally coupled with the heat exchanger) in the double cascade configuration was 12V, drawing a maximum current of 10 A.

Using the single configuration, the temperature measured on the bottom of the wells dropped at an average rate of −0.57° C./s, before reaching a minimum of −11° C. about 60s after activating the Peltier element. The temperature then rose at a steady rate of 0.1° C./s as the heat generated by the "hot side" of the Peltier element overcame the heat dissipation capacity of the heat exchanger. Using the double cascade configuration, the minimum temperature was also achieved around 60 s but was significantly lower at −27.4° C., representing an average drop in temperature of −0.84° C./s. The rise in temperature was the same as for the single element configuration at 0.1° C./s.

To test if the temperature of the well collector could be stabilized and maintained constant at a low temperature, by enhancing heat dissipation on the hot side of the Peltier element, a significant portion of the heat exchanger was arranged to extend outside of the vacuum chamber using a custom vacuum feedthrough. A fan was coupled to the heat exchanger to increase the heat dissipation capacity. FIG. 8 also shows the temperature profile for the single and double Peltier element configurations, where the fan was used to dissipate the heat accumulated by the heat exchanger. The minimum temperature for the single element configuration was reached after 60 seconds and maintained constant at −14.4° C. for the duration of the assay. The temperature measured on the bottom of the wells in the double Peltier element configuration was significantly lower, reaching −30° C. at 60 seconds and dropping further to −32° C. from 180 seconds for the duration of the assay.

Therefore, the use of a fan coupled to a heatsink outside the vacuum chamber provides a cost-effective and simple solution to enhance heat dissipation. This allows maintenance of the temperature gradients between the plasma bulk and the bottom of the PP apparatus 100 (up to 1840 K/m) for the entire duration process duration, ultimately driving an increase in nanoparticle yield in each synthesis run.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A plasma polymerisation apparatus comprising:
    a reaction zone;
    at least one gas inlet for supplying at least one monomer in a gaseous form to the reaction zone;
    a first electrode and a second electrode spaced apart and configured to generate an electric field in the reaction zone to form a plasma-polymer nanoparticulate material from the at least one monomer;
    a plurality of collectors configured to collect the plasma-polymer nanoparticulate material formed in the reaction zone, the plurality of collectors being located adjacent the second electrode and each of the plurality of collectors being three-dimensionally shaped and defining a recess to receive the plasma-polymer nanoparticulate material formed in the reaction zone;
    a cooling device located adjacent the second electrode and configured to cool the plurality of collectors; and
    a confinement grid for confining the electric field in the reaction zone, wherein the confinement grid extends between the first electrode and the second electrode, wherein the confinement grid comprises a mesh having a plurality of openings, and wherein the confinement grid has a tubular or part-tubular structure and a maximum width that is substantially the same as a maximum width of the first and/or second electrodes.

2. The apparatus of claim 1, wherein the cooling device is located between the plurality of collectors and the second electrode.

3. The apparatus of claim 1, wherein the cooling device comprises one or more thermoelectric semiconductor devices.

4. The apparatus of claim 1, wherein the cooling device is coupled to a rear surface of the plurality of collectors.

5. The apparatus of claim 1, wherein the plurality of collectors comprises a plurality of vials or wells, or wherein the plurality of collectors is provided by a well plate.

6. The apparatus of claim 1 further comprising a controller to control the formation of the plasma-polymer nanoparticulate material in the reaction zone.

7. The apparatus of claim 6, wherein the controller controls at least one of: the cooling applied by the cooling device; and plasma input parameters.

8. The apparatus of claim 7, wherein the plasma input parameters include one or more of power to the first or second electrode, flow rate of gases supplied to the reaction zone and/or pressure of gases in the reaction zone.

9. The apparatus of claim 7, wherein the controller controls the cooling applied by the cooling device by adjusting a power supplied to the cooling device by a power supply and/or time periods during which power is supplied to the cooling device by the power supply.

10. The apparatus of claim 6, comprising a user interface, wherein the controller controls based on an input from the user interface.

11. The apparatus of claim 6, comprising a particle sensor, wherein the controller controls based on an input from the particle sensor.

12. The apparatus of claim 6, comprising at least one of:
    a temperature measuring device, wherein the controller controls based on an input from the temperature measuring device;
    and a plasma diagnostic device, wherein the controller controls based on an input from the plasma diagnostic device.

13. The apparatus of claim 1, wherein the second electrode comprises a recess in which (a) the plurality of collectors is at least partially received; and/or (b) the cooling device is at least partially received.

14. The apparatus of claim 1, wherein the reaction zone, the first electrode, the second electrode, the plurality of collectors and the cooling device are located in a reaction chamber.

15. The apparatus of claim 1, wherein each of the plurality of openings has at least one of the following properties:
- a maximum dimension of each of the plurality of openings of between about 50 μm and 5 mm; or
- a shape that is circular, square, oval, rectangular, triangular, pentagonal or hexagonal.

16. The apparatus of claim 11, wherein the particle sensor is configured to determine at least one property of the plasma-polymer nanoparticulate material in the reaction zone.

17. The apparatus of claim 16, wherein the at least one property is one or more of:
- a size of nanoparticles of the plasma-polymer nanoparticulate material or aggregates thereof; and
- a number of nanoparticles of the plasma-polymer nanoparticulate material or aggregates thereof.

18. A method of collecting plasma-polymer nanoparticulate material comprising:
- supplying at least one monomer in a gaseous form to a reaction zone via at least one gas inlet;
- generating an electric field in the reaction zone, between a first electrode and a second electrode spaced apart from the first electrode, to form a plasma-polymer nanoparticulate material from the at least one monomer, wherein the electric field is confined in the reaction zone by a confinement grid, wherein the confinement grid extends between the first electrode and the second electrode, wherein the confinement grid comprises a mesh having a plurality of openings, and wherein the confinement grid has a tubular or part-tubular structure and a maximum width that is substantially the same as a maximum width of the first and/or second electrodes;
- collecting the plasma-polymer nanoparticulate material formed in the reaction zone in a plurality of collectors adjacent the second electrode, each of the plurality of collectors being three-dimensionally shaped and defining a recess to receive the plasma-polymer nanoparticulate material formed in the reaction zone; and
- cooling the plurality of collectors using a cooling device located adjacent the second electrode.

* * * * *